(12) United States Patent
Park et al.

(10) Patent No.: US 7,354,784 B2
(45) Date of Patent: Apr. 8, 2008

(54) METHOD FOR FABRICATING LIQUID CRYSTAL DISPLAY DEVICE OF COLOR-FILTER ON TRANSISTOR TYPE

(75) Inventors: Seung Ryull Park, Anyang-shi (KR); Sang Hee Yu, Gunpo-shi (KR)

(73) Assignee: LG. Philips LCD. Co., Ltd, Seoul (KR)

( * ) Notice: Subject to any disclaimer, the term of this patent is extended or adjusted under 35 U.S.C. 154(b) by 303 days.

(21) Appl. No.: 11/172,233

(22) Filed: Jun. 29, 2005

(65) Prior Publication Data

US 2006/0003479 A1 Jan. 5, 2006

(30) Foreign Application Priority Data

Jun. 30, 2004 (KR) ............ 10-2004-0050381

(51) Int. Cl.
*H01L 21/00* (2006.01)
(52) U.S. Cl. ............ 438/30; 438/59; 438/70; 438/149; 438/151
(58) Field of Classification Search .......... 438/22, 438/30, 38, 48, 149, 151, 155, 158, 97, 199, 438/FOR. 201, FOR. 184, 57, 59, 70; 257/347, 257/E21.326, E21.335, E21.703, E21.705; 349/50, 51, 58, 84, 139, 147, 151, FOR. 129; 313/498, 501, 502
See application file for complete search history.

(56) References Cited

U.S. PATENT DOCUMENTS

2003/0136971 A1* 7/2003 Rhee et al. ............... 257/98

2004/0018655 A1* 1/2004 Song .......................... 438/30
2004/0109101 A1* 6/2004 Kim et al. .................. 349/44

FOREIGN PATENT DOCUMENTS

| JP | 2001-10743 | 2/2001 |
|---|---|---|
| JP | 2004-50235 | 6/2004 |

* cited by examiner

Primary Examiner—Fernando L. Toledo
Assistant Examiner—Quovaunda Jefferson
(74) Attorney, Agent, or Firm—Brinks Hofer Gilson & Lione

(57) ABSTRACT

A method for fabricating a color-filter on transistor (COT) type LCD device, to improve the yield by simplifying the fabrication process with diffraction exposure, which includes the steps of forming a gate line, a gate electrode, a gate pad and a data pad on a substrate; depositing a gate insulating layer and an active layer; forming a data line intersecting the gate line to define a unit pixel region, source and drain electrode on the active layer, and first and second connection conductive layers forming an insulating interlayer on the remaining portions except the first and second connection conductive layers and the drain electrode; forming a color filter layer and a black matrix layer on the insulating interlayer; forming an overcoat layer on the remaining portions of the color filter layer except the first and second connection conductive layers and the drain electrode.

21 Claims, 17 Drawing Sheets

METHOD FOR FABRICATING LIQUID CRYSTAL DISPLAY DEVICE OF COLOR-FILTER ON TRANSISTOR TYPE

This application claims the benefit of Korean Application No. P2004-50381 filed on Jun. 30, 2004, which is hereby incorporated by reference.

TECHNICAL FIELD

The present application relates to a color-filter on transistor (COT) type liquid crystal display (LCD) device, and more particularly, to a method for fabricating a COT type LCD device.

BACKGROUND

Liquid crystal display (LCD) devices have been actively studied and researched owing to advantageous characteristics such as high contrast ratio, fine gray level, high picture quality and low power consumption. An LCD device is suitable for ultra-thin display device such as a wall-mountable television. The LCD device has attracted great attention as a new display device that can substitute for CRT in that the LCD device has thin profile, lightness in weight and low power consumption. As a result, the LCD device is also used for a display device of a notebook computer operated by a battery.

Generally, the LCD device includes a thin film transistor array substrate having a thin film transistor TFT and a pixel electrode in each pixel region defined by intersecting gate and data lines at right angles, a color filter array substrate having a color filter layer and positioned in opposition to the thin film transistor array substrate, and a liquid crystal layer having a dielectric anisotropy, formed between the thin film transistor array substrate and the color filter array substrate. When a voltage is applied to the corresponding pixel region by switching the thin film transistors TFT in the pixel regions of hundreds of thousands by address lines for selection of the pixel region, so that the LCD device is operated.

The color filter array substrate and the thin film transistor array substrate are bonded to each other by a sealant such as epoxy resin. Also, a driving circuit of a PCB (Printed Circuit Board) is connected with the thin film transistor array substrate by a TCP (Tape Carrier Package). However, light leakage may occur due to the misalignment between the thin film transistor array substrate and the color filter array substrate. To overcome this problem, a TOC (TFT On Color Filter) type or COT (Color Filter on TFT) type LCD device, in which the color filter layer and the thin film transistor are formed on one substrate, has been researched and developed.

The COT type LCD device is formed by a method of forming a color filter layer and a thin film transistor on one substrate. As shown in FIG. 1F, the substrate 11 having the color filter layer and the thin film transistor formed thereon is divided into an active region and a pad region. The active region includes the color filter layer and the thin film transistor, and the pad region includes a gate pad 22 and a data pad 25.

On the active region of the substrate 11, there are a gate line (not shown), a data line DL 15, the thin film transistor TFT, an insulating interlayer 16, a black matrix layer 91, the color filter layer of R, G and B 92, an overcoat layer 93 and a pixel electrode 17. The gate line (not shown) intersects the data line 15 at right angles, to define a unit pixel region on the active region. The thin film transistor TFT is formed at the intersecting point of the gate and data lines, to switch signals. Also, the insulating interlayer 16 is formed on an entire surface of the substrate 11 including the thin film transistor TFT. The black matrix layer 91 is formed on the insulating interlayer 16 corresponding to the boundary between the pixel regions, to prevent light leakage. The color filter layer of R, G and B 92 is formed on the insulating interlayer 16 corresponding to the respective pixel regions. Then, the thick overcoat layer 93 is formed on the color filter layer 92, to planarize the entire surface of the substrate 11. The pixel electrode 17 is formed on the overcoat layer 93 of the pixel region, to be in contact with a drain electrode 15b. That is, the pixel electrode 17 is in contact with the drain electrode 15b through a first contact hole 95, wherein the first contact hole 95 is formed by removing the insulating interlayer 16 and the overcoat layer 93.

In addition, the active region includes a storage capacitor, comprised of a storage lower electrode 32, a storage upper electrode 35, and an insulating layer 13 interposed between the storage lower and upper electrodes 32 and 35. The storage capacitor maintains a voltage charged in a liquid crystal capacitor during a turn-off period of the corresponding thin film transistor TFT, so that it is possible to prevent the picture quality from being deteriorated by the parasitic capacitance. Also, the storage lower electrode 32 is formed in parallel with the gate line 12, whereby the storage lower electrode 32 receives am external voltage. Also, the storage upper electrode 35 is in contact with the pixel electrode 17 through a second contact hole 97.

The pad region includes the gate pad G-pad 22 extended from the gate line, and the data pad D-pad 25 extended from the data line. On the gate pad 22 and the data pad 25, there is a deposition layer of a gate insulating layer 13, the insulating interlayer 16 and the overcoat layer 93, wherein the deposition layer includes a pad open area 96. In addition, first and second transparent conductive layers 62 and 65 are formed on the deposition layer, wherein the respective first and second transparent conductive layers 62 and 65 are in contact with the gate pad 22 and the data pad 25 by the pad open area 96.

FIG. 1A to FIG. 1F are cross sectional views showing the fabrication process of the COT type LCD device according to the related art.

As shown in FIG. 1A, a low-resistance metal material is deposited on the substrate 11, and patterned by photolithography, thereby forming the gate line (not shown), a gate electrode 12a, the storage lower electrode 32 and the gate pad 22. Then, the gate insulating layer 13 is formed by depositing an inorganic insulating material such as silicon oxide $SiO_x$ or silicon nitride $SiN_x$ on the entire surface of the substrate 11 including the gate electrode 12a. After that, a semiconductor layer is deposited on the entire surface of the substrate 11, and then selectively removed, to form an active layer 14 on the gate insulating layer 13 above the gate electrode 12a.

As shown in FIG. 1B, a low-resistance metal layer is deposited and patterned on the entire surface of the substrate 11 including the active layer 14, to form the data line 15, source and drain electrodes 15a and 15b, the storage upper electrode 35 and the data pad 25. The deposition layer of the gate electrode 12a, the gate insulating layer 13, the semiconductor layer 14 and the source and drain electrodes 15a and 15b forms the thin film transistor TFT. Subsequently, an inorganic insulating layer is deposited on the entire surface of the substrate 11 including the source and drain electrodes 15a and 15b, thereby forming the insulating interlayer 16.

Referring to FIG. 1C, an opaque organic material having a low dielectric constant is coated and patterned on the insulating interlayer 16, thereby forming the black matrix layer 91 overlapped with the thin film transistor TFT, the data line and the gate line. Subsequently, a color resist is regularly coated and patterned on the black matrix layer 91, whereby the color filter layer of R, G and B 92 is formed in the respective pixel regions.

As shown above, the thin film transistor TFT, the black matrix layer 91 and the color filter layer 92 are formed on one substrate.

Referring to FIG. 1D, an organic insulating material such as BCB (BenzoCycloButene) or photoacryl is coated on the entire surface of the substrate 11 including the color filter layer 92, thereby forming the overcoat layer 93. The overcoat layer 93 is formed to planarize the entire surface of the substrate 11, which is necessary for the COT type LCD device.

As shown in FIG. 1E, the overcoat layer 93, the insulating interlayer 16 and the gate insulating layer 13 are selectively removed to form the first contact hole 95, the second contact hole 97 and the pad open area 96. At this time, the first contact hole 95 exposes the drain electrode 15b, and the second contact hole 97 exposes the storage upper electrode 35. Also, the pad open area 96 exposes the gate pad 22 and the data pad 35.

As shown in FIG. 1F, a transparent conductive material is deposited and patterned on the overcoat layer 93, thereby simultaneously forming the pixel electrode 17 and the first and second transparent conductive layers 62 and 65. The pixel electrode 17 is in contact with the drain electrode 15b and the storage upper electrode 32 through the first and second contact holes 95 and 97. Also, the first and second transparent conductive layers 62 and 65 are in contact with the gate pad 22 and the data pad 25 through the pad open area 96.

Although not shown, a sealant is formed on the boundary between the active region and the pad region, wherein the sealant serves as an adhesive. In this state, the substrate 11 is bonded to another opposite substrate by the sealant, and then a liquid crystal layer is formed between the two substrates, thereby completing the LCD device.

However, the method for fabricating the COT type LCD device according to the related art has the following disadvantages.

In the method for fabricating the COT type LCD device according to the related art, the active layer, the data line and the source and drain electrodes are formed with the individual masks, thereby causing the complicated fabrication process and lowering the yield.

Also, the gate pad and the data pad are formed at the different layers. Accordingly, when opening the gate pad and the data pad, it may have a defect since the gate insulating layer, the insulating interlayer and a passivation layer are deposited on the gate pad, and only the insulating interlayer and passivation layer are deposited on the data pad.

SUMMARY

A method for fabricating a COT type LCD device includes the steps of forming a gate line, a gate electrode, a gate pad and a data pad on a substrate; depositing a gate insulating layer and an active layer on a surface of the substrate including the gate line; patterning the active layer, and forming a contact hole for exposing the gate pad and the data pad; forming a data line intersecting the gate line to define a unit pixel region, source and drain electrode on the active layer, and first and second connection conductive layers being in contact with the gate pad and the data pad through the contact hole; forming an insulating interlayer on portions except the first and second connection conductive layers and the drain electrode; forming a color filter layer and a black matrix layer on the insulating interlayer; forming an overcoat layer on the remaining portions of the color filter layer except the first and second connection conductive layers and the drain electrode; and forming first and second transparent conductive layers on the overcoat layer, for covering the pixel electrode and the first and second connection conductive layers being in contact with the drain electrode.

In another aspect, a method for fabricating a COT type LCD device includes the steps of forming a gate line, a gate electrode, a gate pad and a data pad on a substrate; depositing a gate insulating layer and an active layer on a surface of the substrate including the gate line; forming a contact hole for exposing the gate pad and the data pad by removing the gate insulating layer and the active layer; forming a data line, source and drain electrodes and first and second connection conductive layers by depositing a metal layer on the surface of the substrate including the active layer and patterning the active layer and the metal layer; forming an insulating interlayer on the remaining portions except the first and second connection conductive layers and the drain electrode; forming a color filter layer and a black matrix layer on the insulating interlayer; forming an overcoat layer on the remaining portions of the color filter layer except the first and second connection conductive layers and the drain electrode; and forming first and second transparent conductive layers on the overcoat layer, for covering the pixel electrode and the first and second connection conductive layers being in contact with the drain electrode.

The LCD device is applied to a COT mode. However, the LCD device may be applicable to various modes such as a TN (Twisted Nematic) mode and an IPS (In-Plane Switching) mode.

DETAILED DESCRIPTION

Exemplary embodiments may be better understood with reference to the drawings, but these embodiments are not intended to be of a limiting nature. Like numbered elements in the same or different drawings perform equivalent functions.

Figure 1A:
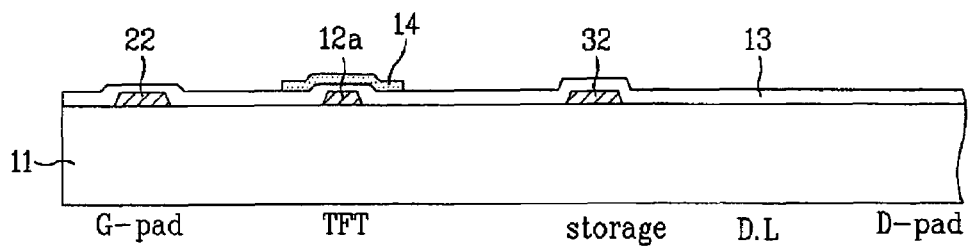
FIG. 1A to FIG. 1F are cross sectional views for showing the fabrication process of an LCD device according to the related art.
Figure 1B:
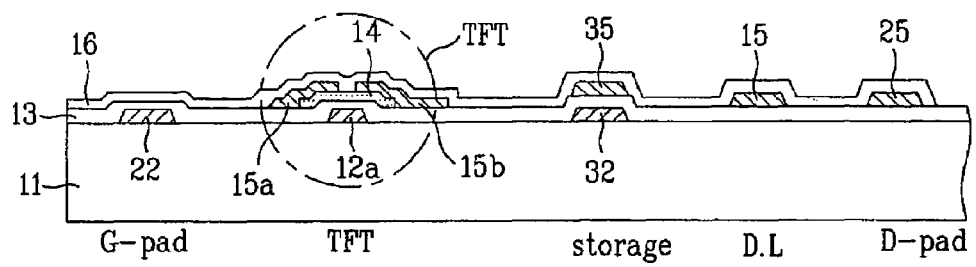
Figure 1C:
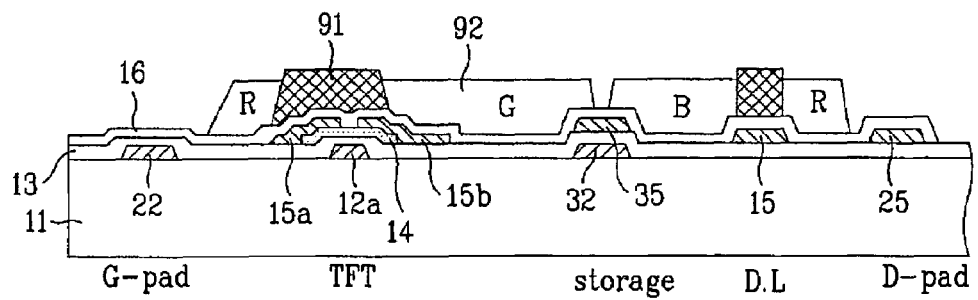
Figure 1D:
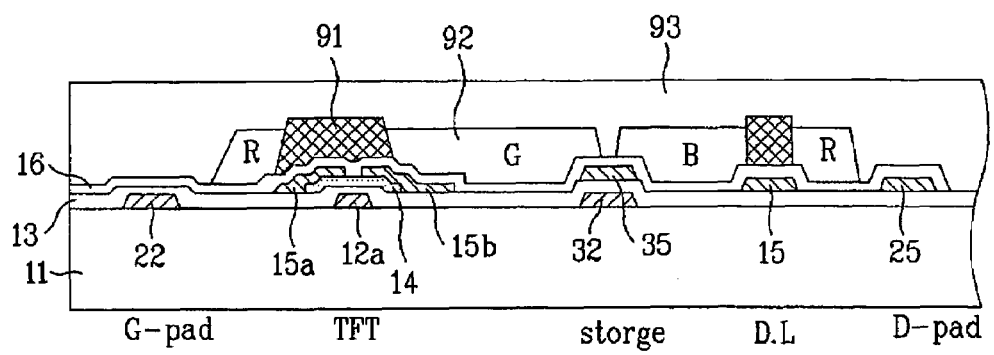
Figure 1E:
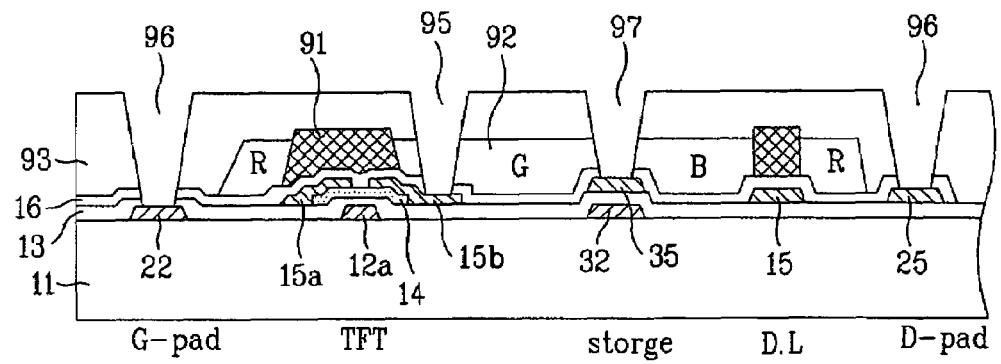
Figure 1F:
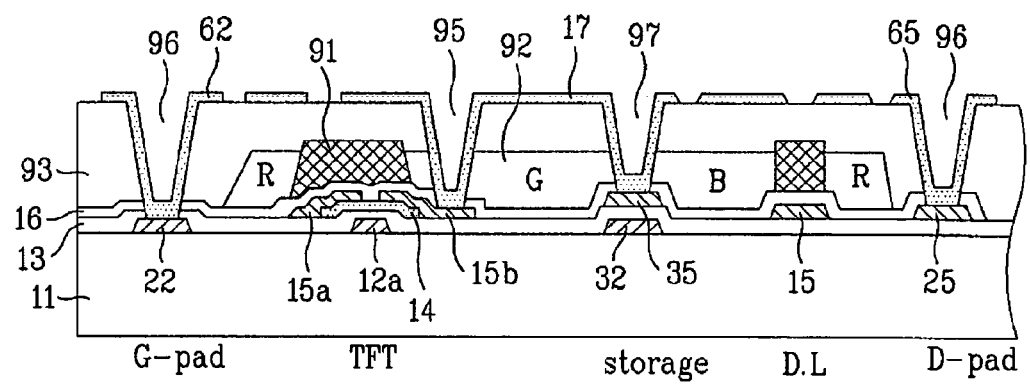
Figure 2:
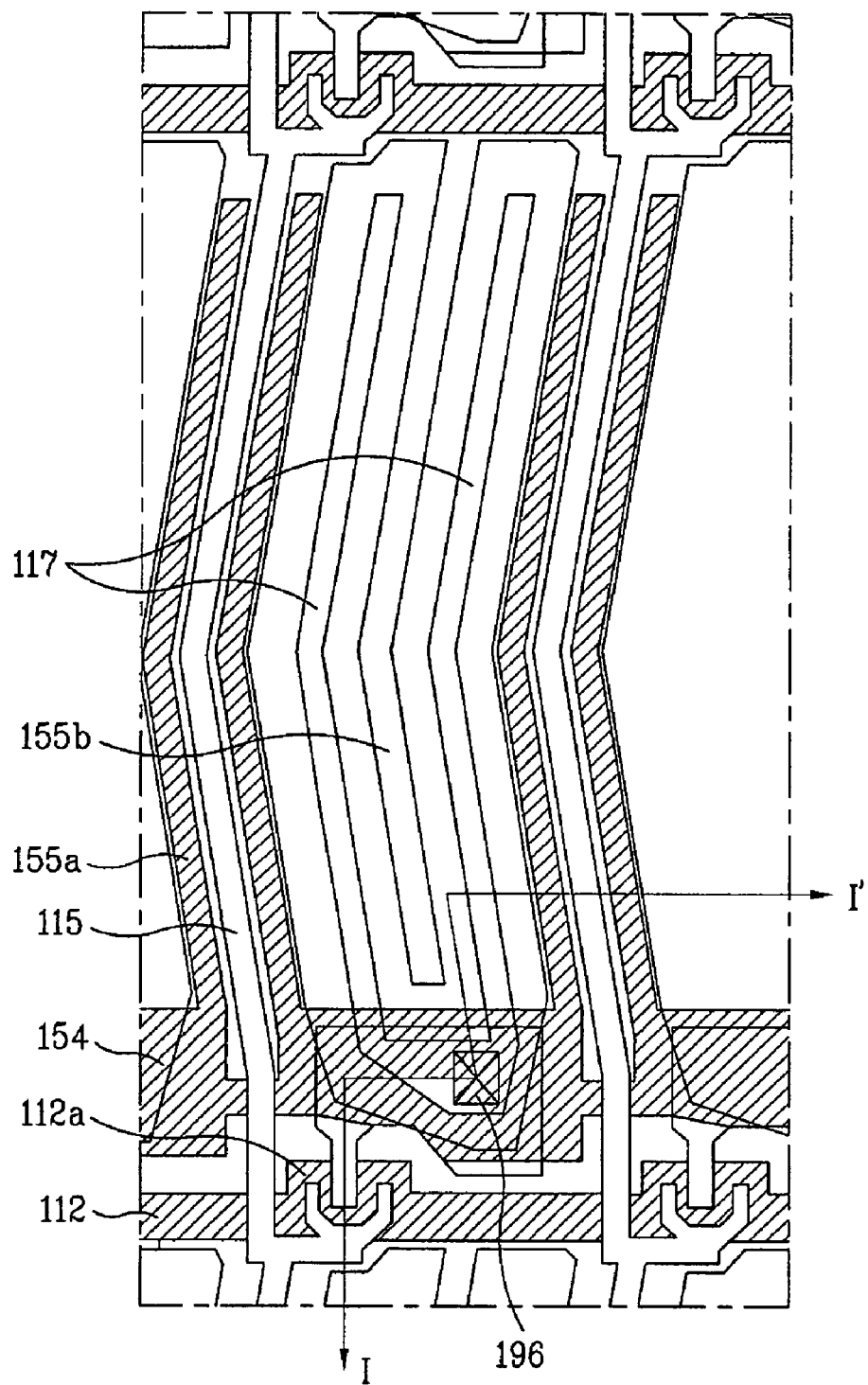
FIG. 2 is a plane view of showing an LCD device according to a first embodiment.
Figure 3:
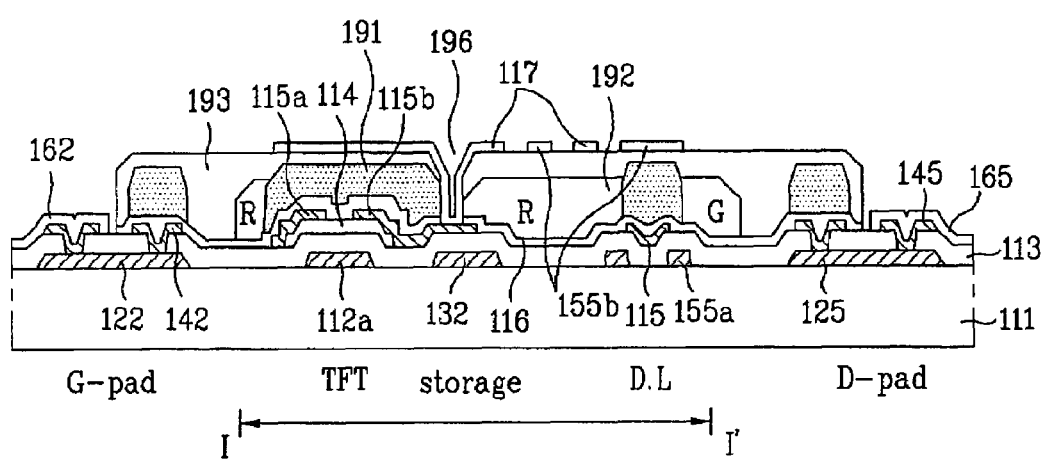
FIG. 3 is a cross sectional view along I-I' of FIG. 2.

In an LCD device according to a first embodiment of the present invention, an active layer and a gate insulating layer are simultaneously patterned with one diffraction exposure, thereby simplifying the fabrication process. FIG. 2 is a plane view of showing an LCD device. FIG. 3 is a cross sectional view along I-I' of FIG. 2. For reference, FIG. 2 shows only the active region.

As shown in FIG. 2 and FIG. 3, a color filter layer 192 and a thin film transistor TFT are formed together on one substrate 111, which is referred to as a COT (color-filter on transistor) type LCD device. The substrate 111 is defined with an active region and a pad region, wherein the active region includes the color filter layer 192 and the thin film transistor TFT, and the pad region includes a gate pad G-pad 122 and a data pad D-pad 125.

On the active region of the substrate 111, there are a gate line 112, a data line 115, the thin film transistor TFT, an insulating interlayer 116, a black matrix layer 191, the color filter layer of R, G and B 192, an overcoat layer 193 and a pixel electrode 117. The gate line intersects the data line at right angles, so that a unit pixel region is defined on the active region. The thin film transistor TFT is formed at the intersecting point of the gate and data lines, wherein the thin film transistor TFT is formed by sequentially depositing a gate electrode 112a, a gate insulating layer 113, an active layer 114 and source and drain electrodes 115a and 115b. The insulating interlayer 116 is formed on a surface of the substrate 111 including the thin film transistor TFT. The black matrix layer 191 is formed on the insulating interlayer, to prevent light leakage. The color filter layer 192 is formed in the respective pixel regions, to display red R, green G and blue B colors. The overcoat layer 193 is formed on the color filter layer 192, to planarize the surface of the color filter layer 192. The pixel electrode 117 is formed on the overcoat layer 193 in each of the pixel regions, to be in contact with the drain electrode 115b.

If the LCD device is formed of an IPS mode, a common electrode and a common line 154 are additionally formed, wherein the common electrode is formed in parallel with the pixel electrode 117, and the common line 154 applies a Vcom signal to the common electrode. The common electrode is divided into first and second common electrodes 155a and 155b. The first common electrode 155a is formed as one body with the common line 154, and the second common electrode 155b is formed at the same layer as the pixel electrode 117, in contact with the common line 154. The first common electrode 155a is formed in the side of the data line 115, and the second common electrode 155b is partially overlapped with the data line 115. Accordingly, an electric field is formed between the first common electrode 155a and the second common electrode 155b, to prevent a parasitic electric field generated between the data line 115 and the adjacent pixel electrode 117.

In state of interposing the gate insulating layer 113 between a storage lower electrode 132 and a storage upper electrode 133, the storage lower electrode 132 is overlapped with the storage upper electrode 133, thereby forming a storage capacitor. In this case, the predetermined portion of the common line 154 functions as the storage lower electrode 132. Also, the storage upper electrode 133 is formed as one body with the drain electrode 1 15b and is not shown separately.

The pad region includes the gate pad 122 and the data pad 125. The gate pad 122 is extended from the gate line 112, to receive an external scanning signal. The data pad 125 is extended from the data line 115, for transmission of a video signal. Also, the respective gate pad 122 and the data pad 125 are in contact with first and second connection conductive layers 142 and 145 through the gate insulating layer 113. The gate pad 122 and the data pad 125 are formed of the same material as the gate line 112, at the same layer as the gate line 112. Also, the first and second connection conductive layers 142 and 145 are formed of the same material as the data line 115, at the same layer as the data line 115.

The insulating interlayer 116 and the overcoat layer 193 are partially removed on predetermined portions of the first and second connection conductive layers 142 and 145 being in direct contact with an external driving circuit. To prevent the exposed portions of the insulating interlayer 116 and the overcoat layer 193 from being oxidized, first and second transparent conductive layers 162 and 165 are additionally formed on the open portions of the first and second connection conductive layers 142 and 145. The first and second transparent conductive layers 162 and 165 are formed of the same material as the pixel electrode 117.

The substrate 111 having the color filter layer and the thin film transistor TFT formed thereon is positioned in opposition to another substrate (not shown), and then the two substrates are bonded to each other. After that, liquid crystal is provided between the two substrates. A sealant (not shown) is formed on the first and second transparent conductive layers 162 and 165 of the pad region, to completely bond the two substrates to each other.

FIG. 4A to FIG. 4H are cross sectional views for showing the fabrication process of the LCD device according to the first embodiment of the present invention.

Figure 4A:
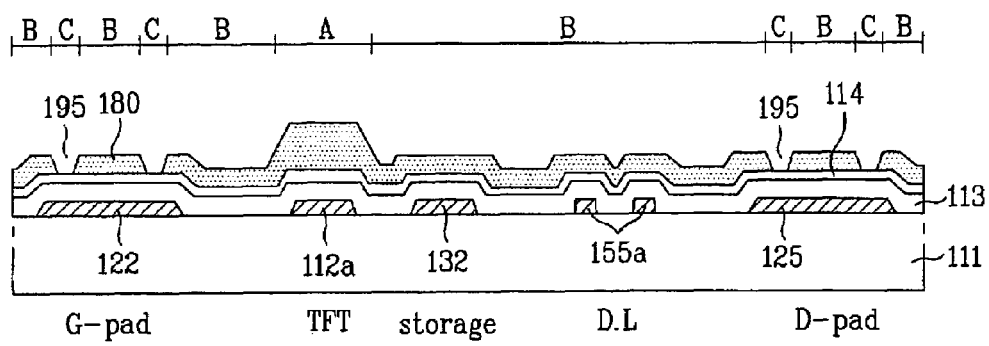
FIG. 4A to FIG. 4H are cross sectional views for showing the fabrication process of an LCD device according to the first embodiment.

As shown in FIG. 4A, a metal material of low resistivity, for example, aluminum Al, aluminum neodymium AlNd, molybdenum Mo, chrome Cr, titanium Ti, tantalum Ta or molybdenum-tungsten MoW, is deposited on the transparent substrate 111 having a high working voltage by sputtering, and then is patterned by photolithography, thereby forming the gate line 112, the gate electrode 112a, the storage lower electrode 132, the common line 154, the first common electrode 155a, the gate pad 122, and the data pad 125. The common line 154 is formed in parallel with the gate line 112, and a predetermined portion of the common line 154 functions as the storage lower electrode 132. The first common electrode 155a projects out from the common line 154, and orthogonal to the gate line 112. Also, the first common electrode 155a is formed on the both sides of the data line 115. The data pad 125 may be formed of the same material as the gate line, when forming the gate line 112.

An inorganic insulating material such as silicon oxide $SiO_x$ or silicon nitride $SiN_x$ is deposited on the surface of the transparent substrate 111 including the gate electrode 112a by plasma enhanced chemical vapor deposition PECVD, so that the gate insulating layer 113 is formed with a thickness of approximately 2000 Å. An amorphous silicon (a-Si:H) layer is deposited by PECVD using the mixed gas of $SiH_4$ and $H_2$, thereby forming the active layer 114. In addition, an $n^+$a-Si layer may be additionally formed by implanting impurity ions onto the amorphous silicon layer.

After coating a photoresist 180 on the active layer 114, the coated photoresist 180 is patterned by diffraction exposure and development. For the diffraction exposure, a diffraction mask is used, for example, a half-tone mask or a slit mask, which includes an open part, a closed part and a diffraction part. Accordingly, the patterned photoresist 180 is divided into three parts A, B and C, wherein the part A corresponds to the closed part of the diffraction mask, the part B corresponds to the diffraction part of the diffraction mask, and the part C corresponds to the open part of the diffraction mask. The photoresist 180 corresponding to the part A of the diffraction mask remains, the photoresist 180 corresponding to the part B is partially removed, and the photoresist 180 corresponding to the part C is completely removed. Since the part C of the patterned photoresist 180 is completely removed, the active layer 114 may be exposed.

The photoresist 180 corresponding to the part A of the diffraction mask remains; only the active layer 114 is removed from the part B, and both the active layer 114 and the gate insulating layer 113 are removed from the part C. As a result, the parts A, B and C of the patterned photoresist 180 have the different thicknesses.

Figure 4B:
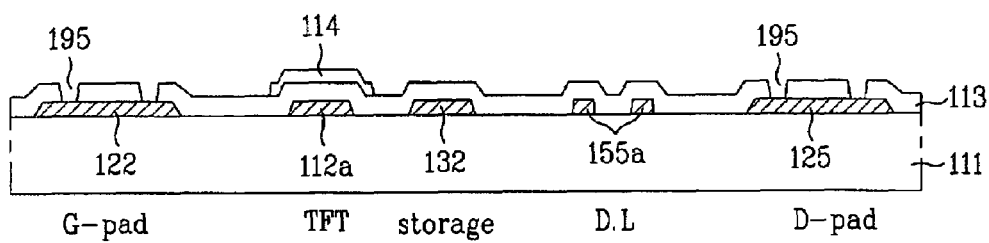

As shown in FIG. 4B, the active layer 114 and the gate insulating layer 113 in the part C are selectively or consecutively etched by using the patterned photoresist 180 as a mask, thereby forming a first contact hole 195 to expose a predetermined portion of the gate pad 122 and the data pad 125. After ashing the photoresist 180 to expose the active layer 114 corresponding to the part B, the exposed active layer 114 is etched. At this time, a residue of the active layer 114 may remain when the active layer 114 is not completely etched. Then, the active layer 114 is formed above the gate electrode 112a by stripping the photoresist 180 corresponding to the part A. Also, it is possible to complete the first contact hole 195 to expose the gate pad 122 and the data pad 125. In the aforementioned process, it is possible to simultaneously perform the processes of patterning the active layer and forming the first contact hole 195 with one diffraction exposure, thereby simplifying the fabrication process.

Figure 4C:
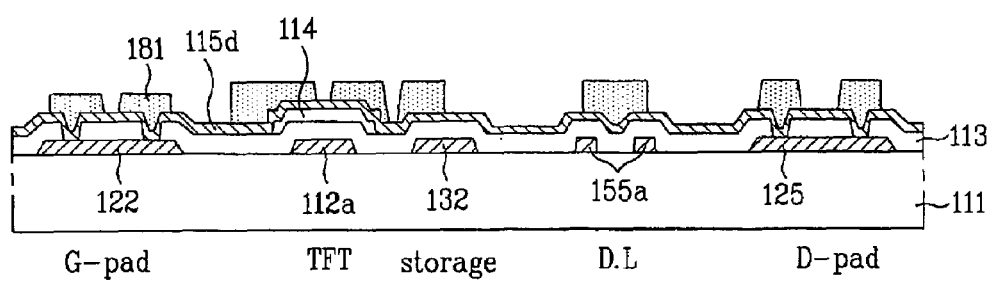

Referring to FIG. 4C, a low-resistance metal material 115d, for example, aluminum Al, aluminum neodymium AlNd, molybdenum Mo, chrome Cr, titanium Ti, tantalum Ta or molybdenum-tungsten MoW, is deposited on the surface of the substrate including the active layer 114. Thereon, a photoresist 181 is coated and patterned. At this time, the photoresist 181 is patterned by the exposure and development process using a general mask, such that the patterned photoresist 181 has a constant thickness.

Figure 4D:
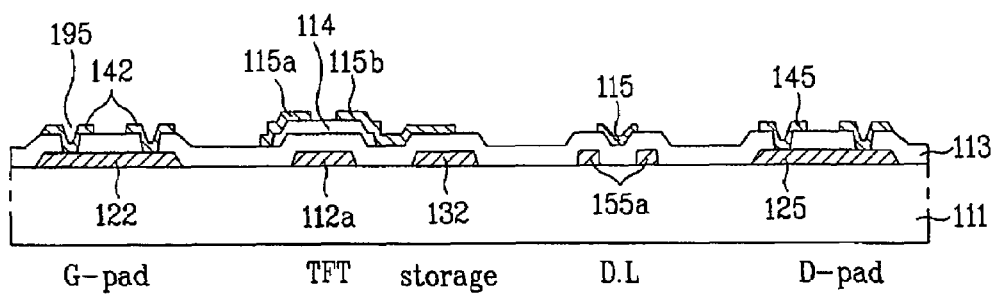

As shown in FIG. 4D, the data line 115, the source and drain electrodes 115a and 115b, the storage upper electrode 135 and the first and second connection conductive layers 142 and 145 are formed by etching the low-resistance metal material 115d exposed by the photoresist 181. The drain electrode 11 5b is formed as one body with the storage upper electrode 135. The thin film transistor TFT is formed by sequentially depositing the gate electrode 112a, the semiconductor layer 114, and the source and drain electrodes 115a and 115b on the active region. Also, the storage capacitor is comprised of the storage lower electrode 132, the gate insulating layer 113 and the storage upper electrode 135. In the meantime, the first and second connection conductive layers 142 and 145 of the pad region are respectively connected with the gate pad 122 and the data pad 125 through the first contact hole 195. As described above, the data line 115 is positioned in parallel with the first common electrode 155a. The first common electrode 155a or the data line 115 may be formed in a zigzag pattern or a straight line pattern.

Figure 4E:
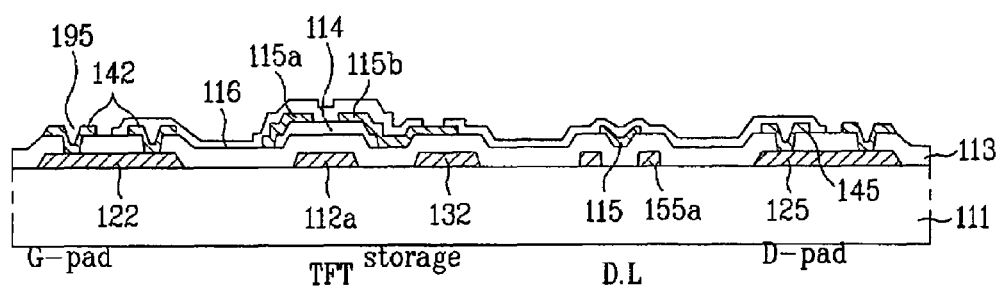

As shown in FIG. 4E, an inorganic insulating material such as silicon oxide $SiO_x$ or silicon nitride $SiN_x$ is deposited on the surface of the substrate including the data line 115, thereby forming the insulating interlayer 116. Thereon, a photoresist (not shown) is deposited and patterned by photolithography, whereby the insulating interlayer 116 is patterned to partially expose the storage upper electrode 135 and the first and second connection conductive layers 142 and 145. Then, a second contact hole 196 for exposing the storage upper electrode 135 is formed in the patterned insulating interlayer 116. Also, the pad region is partially open to expose the first and second connection conductive layers 142 and 145 being in contact with the external driving circuit.

Figure 4F:
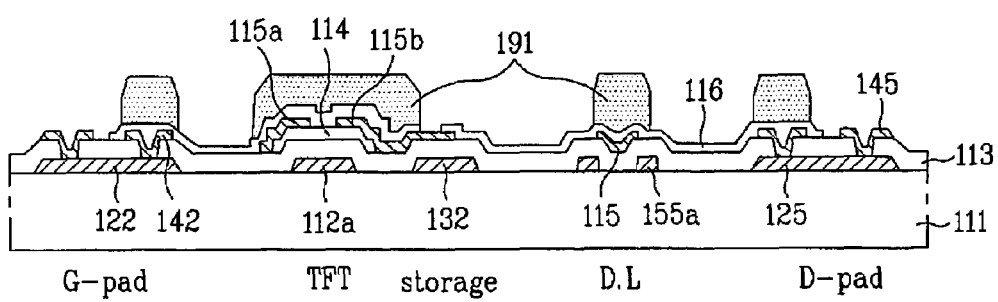

As shown in FIG. 4F, a light-shielding material may be deposited or coated on the entire surface of the substrate including the insulating interlayer 116, and then patterned by photolithography, thereby forming the black matrix layer 191. When coating the light-shielding material on the substrate, it may be preferable to use an organic material including carbon, or a mixed organic and inorganic material containing titanium and having absorbing characteristics. The black matrix layer 191 is formed in correspondence with the portions of forming the thin film transistor TFT, the gate and data lines, the gate pad 122 and the data pad 125, thereby minimizing light leakage in the portions having an unstable electric field.

Figure 4G:
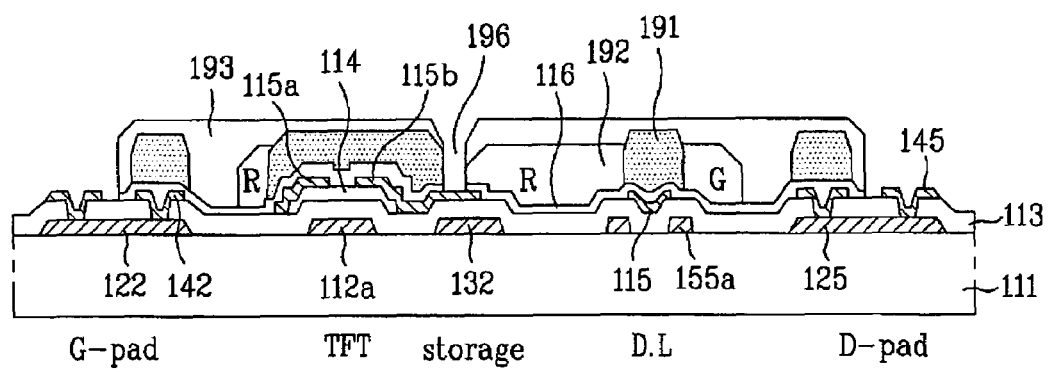

As shown in FIG. 4G, a color resist having photosensitive characteristics is coated on the black matrix layer 191, and then the light is irradiated through a mask above the substrate having the color resist coated thereon. Then, a developer is applied to the coated color resist, whereby the color resist has a desired pattern. As a result, the color filter layer of R, G and B 192 is formed. An overcoat layer 193 is coated on the surface of the substrate including the color filter layer 192, to planarize the entire surface of the substrate. The overcoat layer 193 may be formed of an organic insulating material having the photosensitive characteristics, for example, photoacryl, by a spin coating method or a roll coating method, and then may be patterned by photolithography. On patterning the overcoat layer 193, the pad region being in contact with the external driving circuit is exposed, thereby forming the second contact hole 196 for exposing the storage upper electrode 135. As a result, the insulating interlayer 116 and the overcoat layer 193 have the same pattern. Accordingly, it is possible to pattern the insulating interlayer 116 and the overcoat layer 193 together without an additional process. That is, after patterning the overcoat layer 193, the insulating layer 116 exposed by the patterned overcoat layer 193 is removed. The insulating interlayer 116 and the overcoat layer 193 may be patterned simultaneously or separately.

Figure 4H:
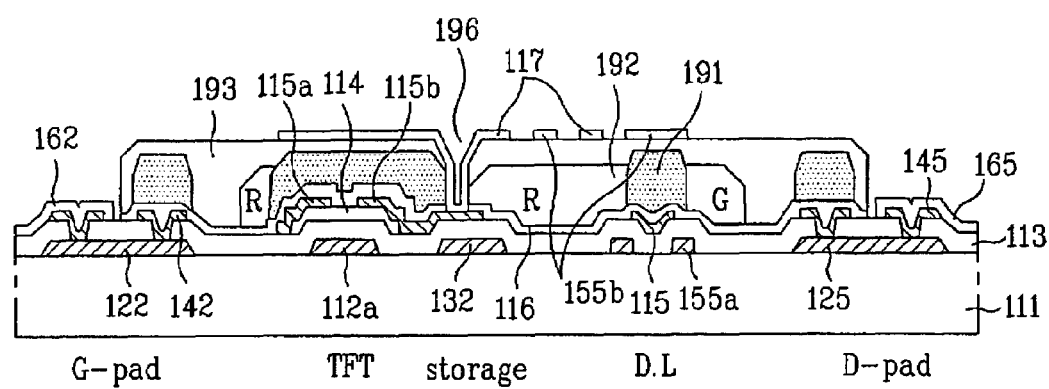

As shown in FIG. 4H, a transparent conductive material such as ITO (Indium-Tin-Oxide) or IZO (Indium-Zinc-Oxide) is deposited and patterned on the surface of the substrate including the overcoat layer 193, thereby forming the pixel electrode 117 in the pixel region, the second common electrode 155b between the pixel electrodes 117, and the first and second transparent conductive layers 162 and 165 in the pad region. At this time, the pixel electrode 117 is in contact with the drain electrode 115b through the second contact hole 196, so that the pixel electrode 117 receives an external voltage. Also, the pixel electrode 117 is formed parallel to the first and second common electrodes 155a and 155b, to generate a transverse electric field. The second common electrode 155b alternates with the pixel electrode 117 in the unit pixel region. Also, the second common electrode 155b is overlapped with the data line 115. Accordingly, an electric field is formed between the first common electrode 155a and the second common electrode 155b, so that it is possible to prevent a parasitic electric field being generated between the data line 115 and the pixel electrode 117.

The first and second transparent conductive layers 162 and 165 are respectively formed on the first and second connection conductive layers 142 and 145 of the pad region wherein the insulating interlayer 116 and the overcoat layer 193 are exposed. Accordingly, it is possible to prevent the first and second connection conductive layers from being oxidized, and to improve the contact characteristics with the external driving circuit. That is, various signals of the external driving circuit are applied to the gate pad 122 and the data pad 125 through the first and second transparent conductive layers 162 and 165 and the first and second connection conductive layers 142 and 145, and then are applied to the gate line 112 and the data line 115. Although not shown, the aforementioned substrate having the thin film transistor TFT and the color filter layer formed thereon is positioned in opposite to another substrate, and the two substrates are bonded to each other, and then a liquid crystal layer is formed between the two substrates, thereby completing a COT type LCD device.

Figure 5:
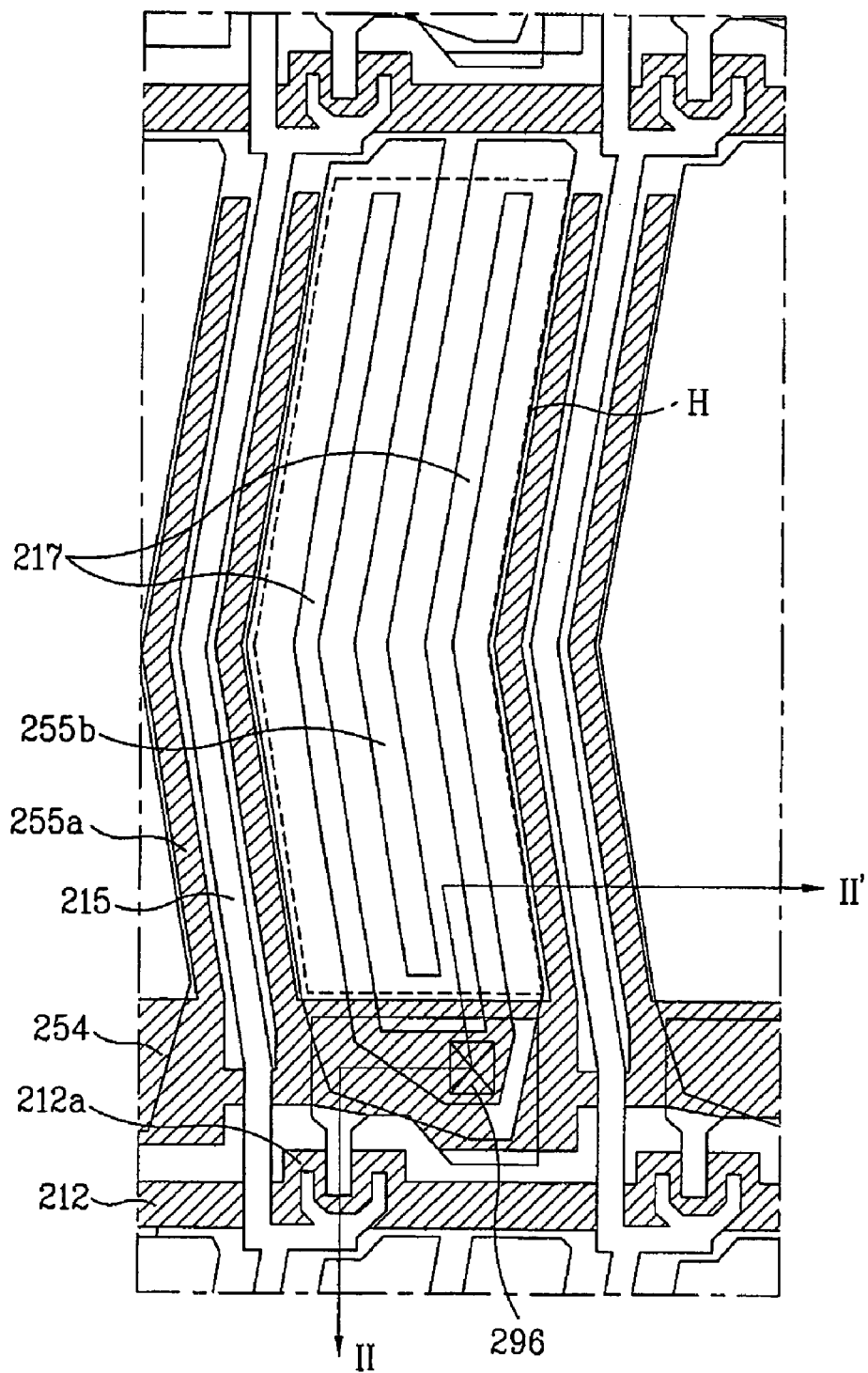
FIG. 5 is a plane view of showing an LCD device according to a second embodiment.
Figure 6:
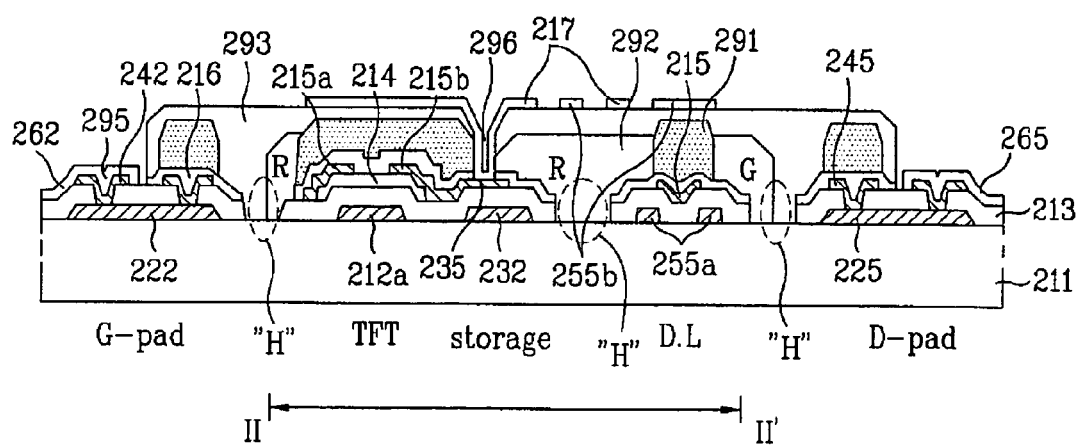
FIG. 6 is a cross sectional view along II-II' of FIG. 5.

An LCD device according to a second embodiment is similar in structure to an LCD device according to the first embodiment however a gate insulating layer is removed from an opening of a pixel region. FIG. 5 is a plan view of showing an LCD device according to the second embodiment. FIG. 6 is a cross sectional view along II-II' of FIG. 5. For clarity, FIG. 5 shows only the active region.

As shown in FIG. 5 and FIG. 6, an LCD device according to the second embodiment includes a gate line 212, a data line 215, the gate insulating layer 213, a thin film transistor TFT, an insulating interlayer 216, a black matrix layer 291, a color filter layer of R, G and B 292, an overcoat layer 293, a pixel electrode 217, and first and second common electrodes 255a and 255b. The gate line 212 intersects the data line 215 at right angles on a substrate 211, thereby defining a unit pixel region. The gate insulating layer 213 is formed between the gate line 212 and the data line 215 to insulate the gate and data lines 212 and 215 from each other, wherein the gate insulating layer 213 is removed from the opening of the pixel region. Also, the thin film transistor TFT is formed at the intersecting point of the gate line 212 and the data line 215, for selective switching of various signals. The insulating interlayer 216 is formed on an entire surface of the substrate 211 including the thin film transistor TFT. The black matrix layer 291 is formed on the insulating interlayer 216, to prevent light leakage. The color filter layer of R, G and B 292 is formed in the respective pixel regions, to represent various colors. Also, the overcoat layer 293 is formed on the color filter layer 292, for planarization of the entire surface of the substrate. The pixel electrode 217 is formed on the overcoat layer 293, wherein the pixel electrode 217 is in contact with a drain electrode 215b. The first and second common electrodes 255a and 255b are alternately formed in parallel with the pixel electrode 217, thereby generating a transverse electric field.

A pad region in the LCD device according to the second embodiment is similar in structure to a pad region in the LCD device according to the first embodiment. The pad region of the LCD device according to the second embodiment includes a gate pad 222 extended from the gate line 212, and a data pad 225 extended from the data line 215. A first connection conductive layer 242 and a first transparent conductive layer 262 are sequentially deposited on the gate pad 222. Also, a second connection conductive layer 245 and a second transparent conductive layer 265 are sequentially deposited on the data pad 255.

The gate insulating layer 213 is removed from the opening of the pixel region, thereby improving the transmissivity in the opening of the pixel region. The gate insulating layer 213 may be removed simultaneously when patterning an active layer 114 of the thin film transistor TFT, so that an additional mask is not required.

Further, a diffraction exposure mask can be conveniently fabricated since it is possible to decrease the size of a diffraction part in the diffraction exposure mask used when simultaneously patterning the active layer 114 and the gate insulating layer 213. According as the gate insulating layer is removed from the opening of the pixel region, the active layer formed on the gate insulating layer is also removed, thereby preventing bright spots from being generated in a black state.

FIG. 7A to FIG. 7H are cross sectional views for showing the fabrication process of the COT type LCD device according to the second embodiment.

Figure 7A:
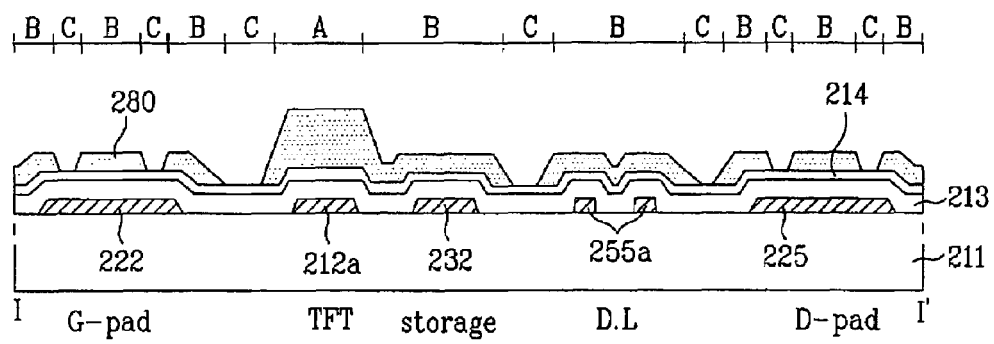
FIG. 7A to FIG. 7H are cross sectional views for showing the fabrication process of an LCD device according to the second embodiment.

As shown in FIG. 7A, a low-resistance metal material is deposited on the substrate 211, and then patterned by photolithography, thereby forming the gate line 212, a gate electrode 212a, a storage lower electrode 232, a common line 254, a first common electrode 255a, the gate pad 222 and the data pad 225. The common line 254 is formed in parallel with the gate line 212, and a predetermined portion of the common line 254 functions as the storage lower electrode 232. The first common electrode 255a projects outward from the common line 254, such that the first common electrode 255a is formed substantially perpendicular to the common line 254. Also, the first common electrode 255a is formed in the both sides of the data line. An inorganic insulating material such as silicon oxide $SiO_x$ or silicon nitride $SiN_x$ is deposited on the surface of the substrate 211 including the gate electrode 212a, thereby forming the gate insulating layer 213. Thereon, an amorphous silicon (a-Si:H) layer is deposited to form the active layer 214. An $n^+$a-Si layer may be formed by implanting impurity ions onto the amorphous silicon layer.

After coating a photoresist 280 on the active layer 214, the coated photoresist 280 is patterned by diffraction exposure and development. For the diffraction exposure, a diffraction mask is used, for example, a half-tone mask or a slit mask, which includes an open part, a closed part and a diffraction part. The transmissivity of desired level in the diffraction part of the diffraction mask is obtained by controlling the conditions such as the thickness of semi-transparent layer or the density of slits.

The photoresist 280 patterned with the diffraction mask is divided into three parts A, B and C, wherein the part A corresponds to the closed part of the diffraction mask, the part B corresponds to the diffraction part of the diffraction mask, and the part C corresponds to the open part of the diffraction mask. The photoresist 280 corresponding to the part A of the diffraction mask remains, the photoresist 280 corresponding to the part B is partially removed, and the photoresist 280 corresponding to the part C is completely removed. Since the part C of the patterned photoresist 280 is completely removed, the active layer 214 of the part C is exposed. That is, the photoresist 280 corresponding to the part A of the diffraction mask remains; only the active layer 214 is removed from the part B, and both the active layer 214 and the gate insulating layer 213 are removed from the part C. Accordingly, the parts A, B and C of the patterned photoresist 280 have the different thicknesses.

The photoresist corresponding to the opening of the pixel region is removed to remove the gate insulating layer 213 corresponding to the opening of the pixel region. Compared with LCD device of the first embodiment, the size of the diffraction part (B) decreases, and the size of the open part (C) increases. As a result, it is possible to fabricate the diffraction mask with the simple and easy process (FIG. 4A and FIG. 7A).

Figure 7B:
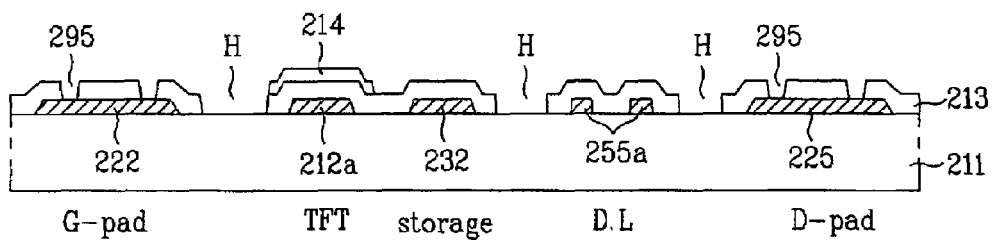

As shown in FIG. 7B, the active layer 214 and the gate insulating layer 213 in part C are selectively or consecutively etched by using the patterned photoresist 280 as a mask, thereby forming a first contact hole 295 for exposing the predetermined portion of the gate pad 222 and the data pad 225, and forming the opening H in the pixel region. After ashing the photoresist 280 to expose the active layer 214 corresponding to the part B, the exposed active layer 214 is etched. The residue of the active layer 214 may remain when the active layer 214 is not completely etched. The removed area of the gate insulating layer 213 is larger than that in the LCD device according to the first embodiment of the present invention, so that it is possible to prevent bright spots from being generating. The active layer 214 is formed above the gate electrode 212a by stripping the remaining photoresist 280 corresponding to the part A of the diffraction mask. Also, it is possible to form the first contact hole 295 for exposing the gate pad 222 and the data pad 225. In addition, the opening H is formed in the pixel region by removing the gate insulating layer 213. Accordingly, both the active layer and the gate insulating layer are patterned together with one diffraction exposure, thereby simplifying the fabrication process.

Figure 7C:
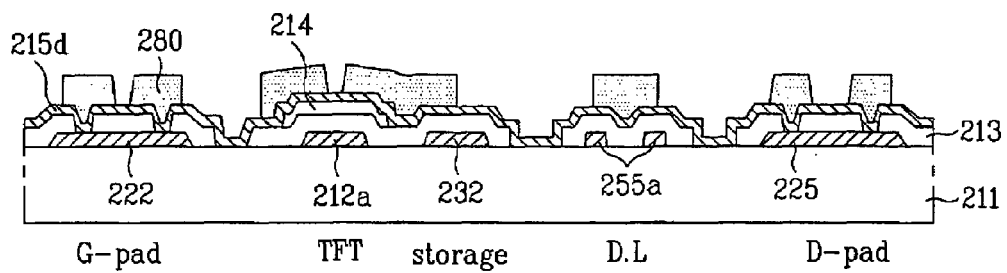
Figure 7D:
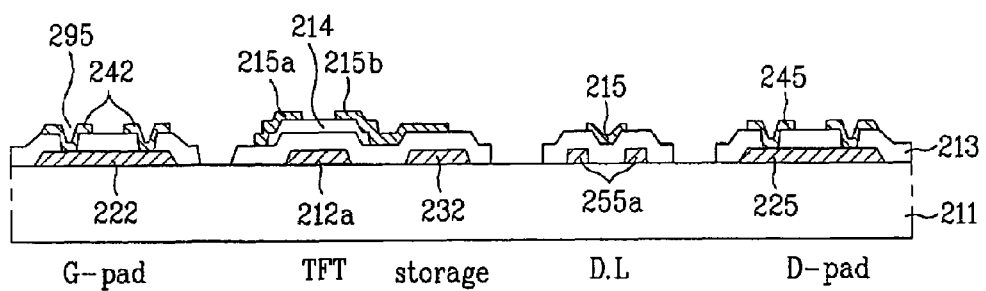

Referring to FIG. 7C, a low-resistance metal material 215d is deposited on the surface of the substrate including the active layer 214. Thereon, a photoresist 280 is coated and patterned. As shown in FIG. 7D, the low-resistance metal material 215d exposed by the patterned photoresist 280 is etched to form the data line 215, source and drain electrodes 215a and 215b, a storage upper electrode 235 and first and second connection conductive layers 242 and 245. The drain electrode 215b may be formed as one body with the storage upper electrode 235. The first and second connection conductive layers 242 and 245 are in contact with the gate pad 222 and the data pad 225. The data line 215 is positioned between and parallel to the first common electrodes 255a 1. The thin film transistor TFT is formed by sequentially depositing the gate electrode 212a, a semiconductor layer 214 and the source and drain electrodes 215a and 215b. Also, a storage capacitor is formed of the storage lower electrode 232, the gate insulating layer 213 and the storage upper electrode 235. The gate line 212 intersects the data line 215 at right angles, to define the unit pixel region.

Figure 7E:
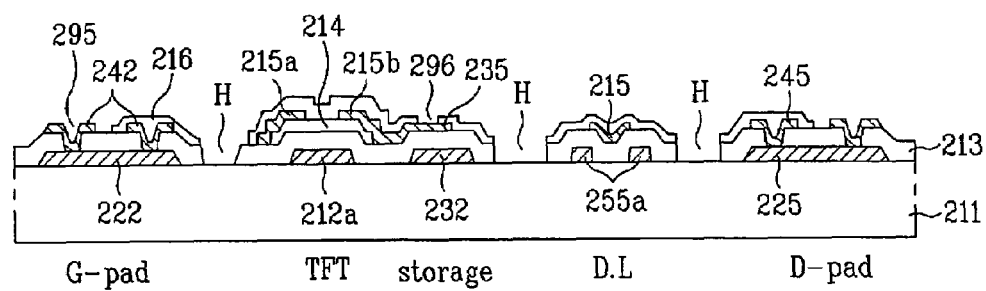

As shown in FIG. 7E, an inorganic insulating material, such as silicon oxide $SiO_x$ or silicon nitride $SiN_x$, is deposited and patterned on the surface of the substrate including the data line 215, thereby forming the insulating interlayer 216. By patterning the insulating interlayer 216, it is possible to form a second contact hole 296 for exposing the storage upper electrode 235, and to expose the first and second connection conductive layers 242 and 245 to be contact with the external driving circuit. The insulating interlayer 216 corresponding to the opening H of the pixel region is also removed.

Figure 7F:
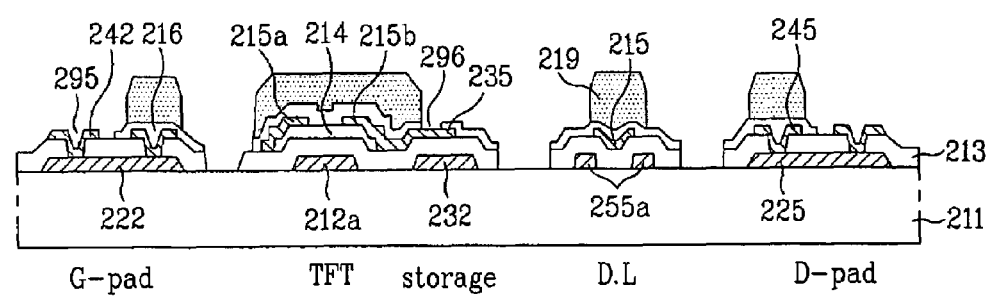

As shown in FIG. 7F, a light-shielding material may be deposited or coated on the entire surface of the substrate including the insulating interlayer 216, and then patterned by photolithography, thereby forming the black matrix layer 219. When coating the light-shielding material on the substrate, it is preferable to use an organic material including carbon, or a mixed organic and inorganic material including titanium having absorbing characteristics.

Figure 7G:
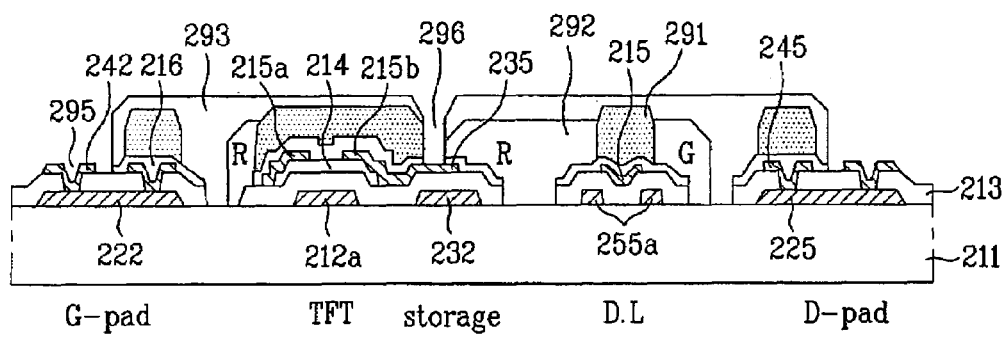

Referring to FIG. 7G, the color filter layer of R, G and B 292 is formed in the respective pixel regions. Then, the overcoat layer 293 is coated and patterned on the entire surface of the substrate including the color filter layer 292, to planarize the entire surface of the substrate. The first and second connection conductive layers 252 and 265, for contacting the external driving circuit, are open when patterning the overcoat layer 293. Also, the second contact hole 296 is formed to expose the storage upper electrode 235.

Figure 7H:
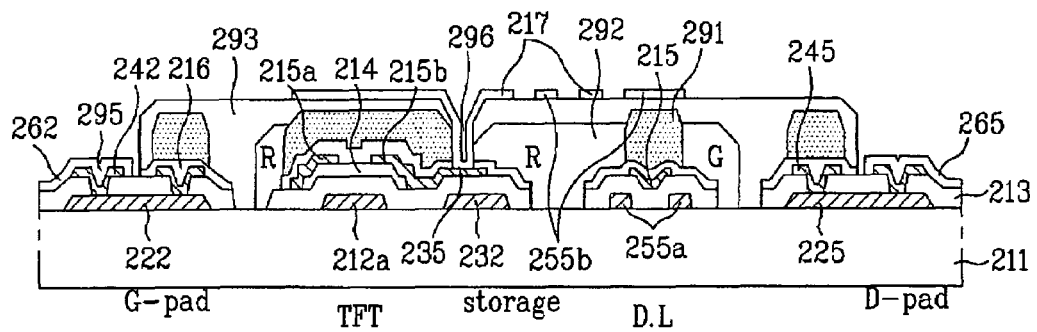

As shown in FIG. 7H, a transparent conductive layer such as ITO (Indium-Tin-Oxide) or IZO (Indium-Zinc-Oxide) is deposited and patterned on the entire surface of the substrate including the overcoat layer 293, thereby forming the pixel electrode 217, the second common electrode 255b and the first and second transparent conductive layers 262 and 265. The pixel electrode 217 is in contact with the drain electrode 215b through the second contact hole 296, whereby the pixel electrode 217 generates the transverse electric field with the first and second common electrodes 255a and 255b. The second common electrode 255b alternates with the pixel electrode 217 in the pixel region. Also, the second common electrode 255b is overlapped with the data line 215. Accordingly, the electric field is formed between the first and second common electrodes 255a and 255b, so that it is possible to minimize a parasitic electric field between the data line 215 and the pixel electrode 217. The first and second transparent conductive layers 262 and 265 are respectively formed on the first and second connection conductive layers 242 and 245 of the pad region wherein the insulating interlayer 216 and the overcoat layer 293 are open. Accordingly, it is possible to prevent the first and second connection conductive layers from being oxidized, and to improve the contact characteristics with the external driving circuit.

Although not shown, the aforementioned substrate having the thin film transistor TFT and the color filter layer formed thereon is positioned in opposition to another substrate, and the two substrates are bonded to each other, and then a liquid crystal layer is formed between the two substrates, thereby completing a COT type LCD device according to the second. In the aforementioned LCD device according to the second embodiment of the present invention, the gate insulating layer and the active layer are patterned simultaneously, so that it is possible to simplify the fabrication process. In addition, it is possible to improve the transmissivity by removing the gate insulating layer and the insulating interlayer from the opening of the pixel region.

Figure 8:
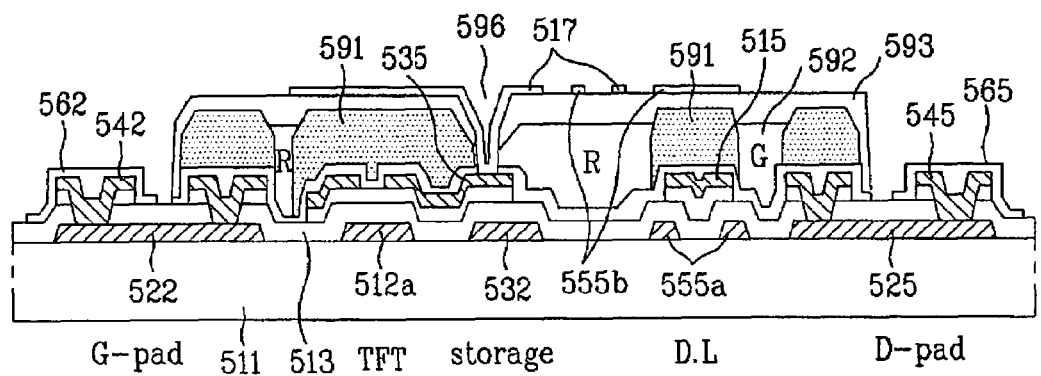
FIG. 8 is a plane view of showing an LCD device according to a third embodiment.

As shown in FIG. 8, an LCD device according to the third embodiment includes a substrate 511, a gate line (not shown), a gate electrode 512a, a storage lower electrode 532, a data pad 525, a gate insulating layer 513, a data line 515, source and drain electrodes 515a and 515b, a storage upper electrode 535 and first and second connection conductive layers 542 and 545. The gate insulating layer 513 is formed on an entire surface of the substrate 511 including the gate electrode 512a. Also, the data line 515 is formed on the gate insulating layer 513.

A data line layer and an active layer are patterned by diffraction exposure, the active layer 514 is formed below the data line 515, the source and drain electrodes 515a and 515b, the storage upper electrode 535 and the first and second connection conductive layers 542 and 545. The first and second connection conductive layer 542 and 545 are respectively connected with a gate pad 522 and the data pad 525 by a first contact hole 595, wherein the first contact hole 595 is formed by removing the gate insulating layer 513.

On the data line layer, there are an insulating interlayer 516, a black matrix layer 591, a color filter layer 592 and an overcoat layer 593. A pixel electrode 517 is formed on the overcoat layer 593, wherein the pixel electrode 517 is in contact with the drain electrode 515b or the storage upper electrode 535 by a second contact hole 596. In addition, common electrodes 555a and 555b are formed between, and parallel to, the pixel electrodes 517, thereby generating a transverse electric field. The insulating interlayer 516 and the overcoat layer 593 are removed from the portion corresponding to the first and second connection conductive layers 542 and 545 being in contact with an external driving circuit. Also, first and second transparent conductive layers 562 and 565 are in contact with the first and second connection conductive layers 542 and 545.

A method for fabricating the LCD device according to the third embodiment of the present invention will be described as follows. FIG. 9A to FIG. 9H are cross sectional views for showing the fabrication process of the LCD device according to the third embodiment of the present invention.

Figure 9A:
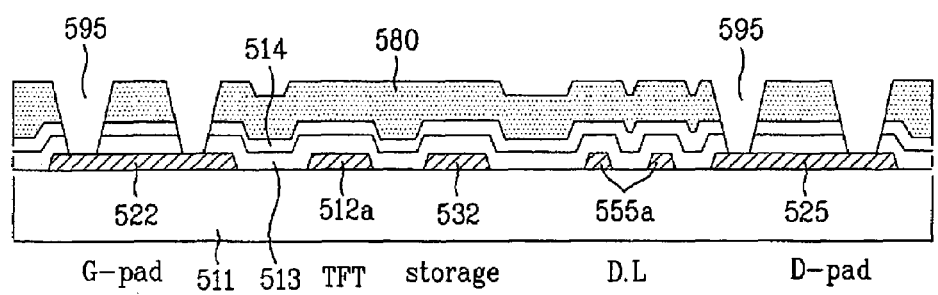
FIG. 9A to FIG. 9H are cross sectional views for showing the fabrication process of an LCD device according to the third embodiment.

As shown in FIG. 9A, a low-resistance metal material is deposited on the substrate 511, and then patterned by photolithography, thereby forming the gate line 512, the gate electrode 512a, the storage lower electrode 532, a common line 554, the first common electrode 555a, the gate pad 552 and the data pad 525. The common line 554 is formed parallel to the gate line 512, and a predetermined portion of the common line 554 functions as the storage lower electrode 532. The first common electrode 555a projects out from the common line 554, wherein the first common electrode 555a is formed substantially perpendicular to the gate line 512. The first common electrode 555a is formed on the both sides of the data line.

An inorganic insulating material such as silicon oxide $SiO_x$ or silicon nitride $SiN_x$ is deposited on the entire surface of the transparent substrate 511 including the gate electrode 512a, to form the gate insulating layer 513. On the gate insulating layer 513, an amorphous silicon (a-Si:H) layer is deposited to form the active layer 514. In addition, an $n^+$a-Si layer may be formed by implanting impurity ions onto the amorphous silicon layer. Subsequently, a photoresist 580 is coated and patterned on the active layer 514. Then, the first contact hole 595 for exposing the gate pad 522 and the data pad 525 is formed by etching the gate insulating layer 513 and the active layer 514 exposed by the patterned photoresist 580, and the photoresist 580 removed.

Figure 9B:
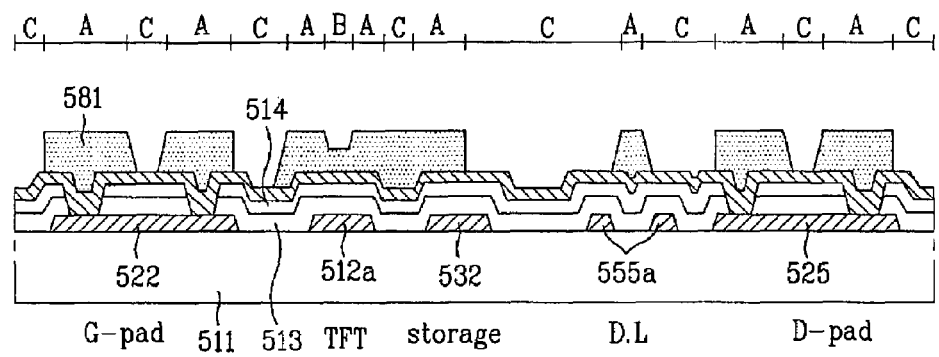

As shown in FIG. 9B, a low-resistance metal material 515d is deposited on the entire surface of the substrate including the active layer 514. A photoresist 581 is coated thereon and patterned to have different thicknesses. To obtain the different thicknesses in the photoresist 581, a diffraction mask having a predetermined pattern is positioned above the photoresist 581, and a UV ray or X-ray wavelength is irradiated thereon, and then the exposed photoresist 581 is developed. , The diffraction mask is used to obtain the different thicknesses in pattern of the photoresist 581. After patterning the photoresist 580, the portion (channel layer) between the source electrode ('515a' of FIG. 9D) and the drain electrode ('515b' of FIG. 9D) becomes thinner than the remaining portions. That is, the photoresist 580 patterned with the diffraction mask is divided into three parts A, B and C, wherein the part A corresponds to a closed part of the diffraction mask, the part B corresponds to a diffraction part of the diffraction mask, and the part C corresponds to an open part of the diffraction mask. The photoresist 580 corresponding to the part A of the diffraction mask remains, the photoresist 580 corresponding to the part B is partially removed, and the photoresist 580 corresponding to the part C is completely removed. Since the part C of the patterned photoresist 580 is completely removed, the low-resistance metal material 515 is exposed. In the LCD device according to the third embodiment of the present invention, the part B corresponds to the channel layer. Accordingly, as compared with the first and second embodiments of the present invention, the size of diffraction part decreases. As a result, it is possible to fabricate the diffraction mask with the simple and easy process, thereby decreasing the fabrication cost and operation defect.

Figure 9C:
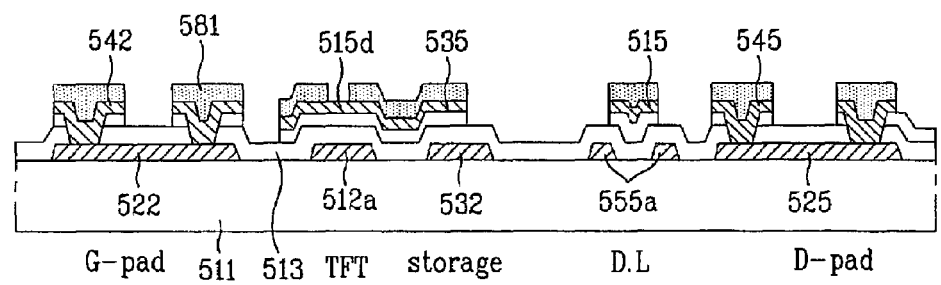
Figure 9D:
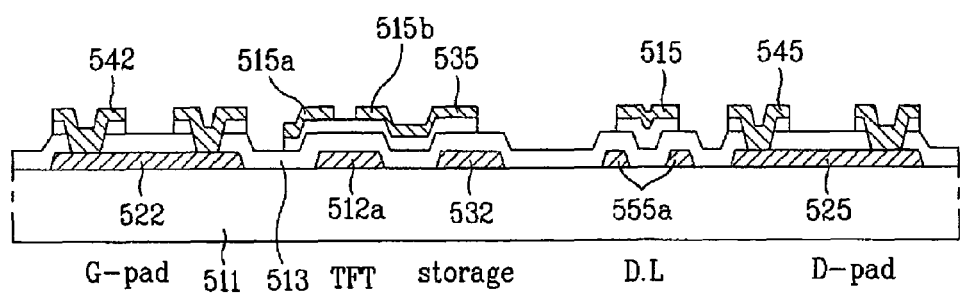

As shown in FIG. 9C, the exposed low-resistance metal layer 515d and active layer 514 are simultaneously etched by using the patterned photoresist 581 as a mask. Then, the photoresist 581 is ashed until the thin portion of the photoresist 581 is removed. Referring to FIG. 9D, the source and drain electrodes 515a and 515b are formed by etching the exposed low-resistance metal layer 515d of the channel region of the thin film transistor using the ashed photoresist 581 as a mask. At this time, the $n^+$a-Si layer, which functions as an ohmic contact layer, may be etched together with the exposed low-resistance metal layer 515d. Then, the data line 515 is formed substantially perpendicular to the gate line. Also, the source and drain electrodes 515a and 515b are formed above the gate electrode 512a. The storage upper electrode 535 is overlapped with the storage lower electrode 532. The first and second connection conductive layers 542 and 545 are in contact with the gate pad 522 and the data pad 525. The drain electrode 515b is formed as one body with the storage upper electrode 535, and the data line 515 is formed in parallel with the first common electrode 555a. The thin film transistor TFT is formed by sequentially depositing the gate electrode 512a, a semiconductor layer 514, and the source and drain electrodes 515a and 515b.

Figure 9E:
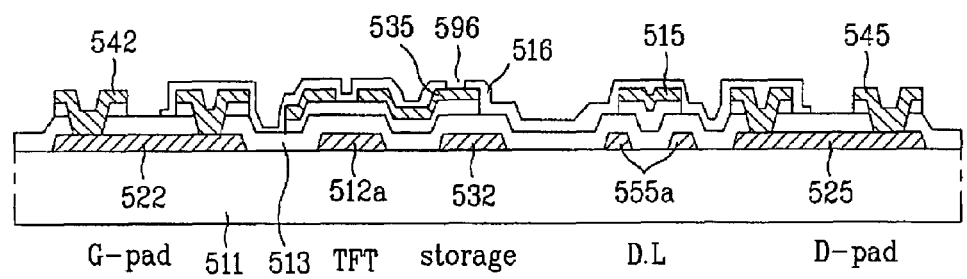

As shown in FIG. 9E, an inorganic insulating material such as silicon oxide $SiO_x$ or silicon nitride $SiN_x$ is deposited and patterned on the entire surface of the substrate including the data line 515, to form the insulating interlayer 516. The second contact hole 596 for exposing the storage upper electrode 535 is formed by patterning the insulating interlayer 516. The first and second connection conductive layers 542 and 545 are exposed for contacting the external driving circuit.

Figure 9F:
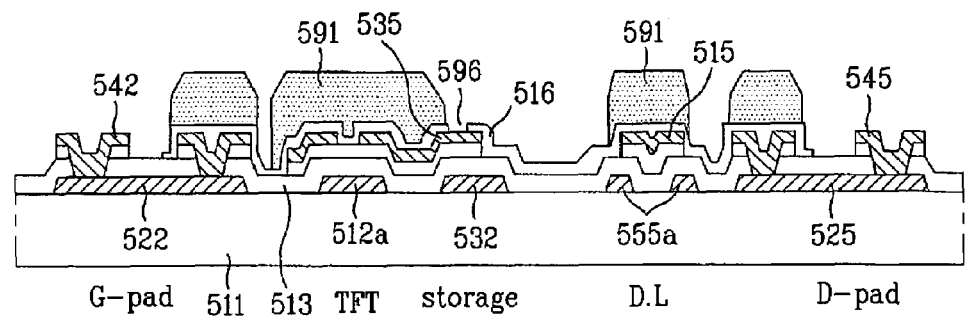

As shown in FIG. 9F, a light-shielding material may be deposited or coated on the entire surface of the substrate including the insulating interlayer 516, and then patterned by photolithography, thereby forming the black matrix layer 591 in correspondence with the thin film transistor TFT, the gate and data lines, the gate pad 522 and the data pad 525. When coating the light-shielding material on the substrate, it is preferable to use an organic material including carbon, or a mixed organic an inorganic material including titanium having absorbing characteristics.

Figure 9G:
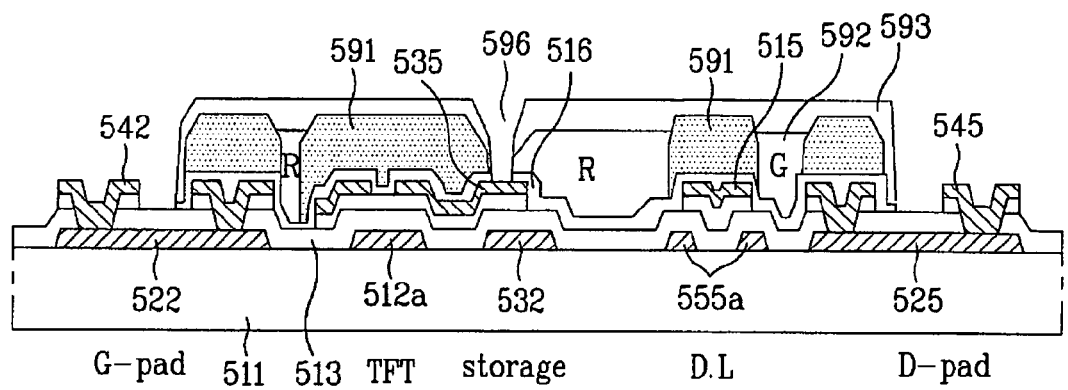

As shown in FIG. 9G, the color filter layer of R, G and B 592 is formed in the respective pixel regions, and the overcoat layer 593 is coated and patterned on the entire surface of the substrate including the color filter layer 592, to planarize the entire surface of the substrate. The first and second connection conductive layers 552 and 565 are open for being in contact with the external driving circuit. The second contact hole 596 is formed to expose the storage upper electrode 535. The insulating interlayer 516 and the overcoat layer 593 have the same pattern. That is, the insulating interlayer 516 and the overcoat layer 593 may be patterned together without the separate patterning process.

Figure 9H:
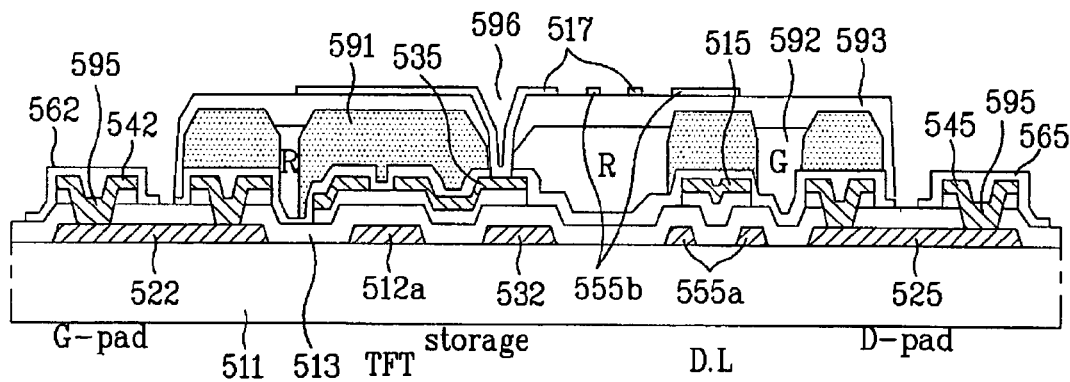

As shown in FIG. 9H, a transparent conductive layer such as ITO (Indium-Tin-Oxide) or IZO (Indium-Zinc-Oxide) is deposited and patterned on the entire surface of the substrate including the overcoat layer 593, thereby simultaneously forming the pixel electrode 517, the second common electrode 555b and the first and second transparent conductive layers 562 and 565. The pixel electrode 517 is in contact with the drain electrode 515b through the second contact hole 596, whereby the pixel electrode 517 generates a transverse electric field with the first and second common electrodes 555a and 555b. The second common electrode 555b alternates with the pixel electrode 517 in the unit pixel region. Also, the second common electrode 555b is overlapped with the data line 515. An electric field is formed between the first and second common electrodes 555a and 555b, so that it is possible to minimize the parasitic electric field between the data line 515 and the pixel electrode 517. In the meantime, the first and second transparent conductive layers 562 and 565 are respectively formed on the first and second connection conductive layers 542 and 545 of the pad region wherein the insulating interlayer 516 and the overcoat layer 593 are open.

Although not shown, the aforementioned substrate having the thin film transistor TFT and the color filter layer formed thereon is positioned in opposite to another substrate, and the two substrates are bonded to each other, and then a liquid crystal layer is formed between the two substrates, thereby completing a COT type LCD device The active layer and the data line layer are patterned together, thereby simplifying the fabrication process.

As mentioned above, the method for fabricating the COT type LCD device has the following characteristics:

The thin film transistor and the color filter layer are formed on the same substrate. Also, the gate pad and the data pad are formed of the material for the gate line, and the first and second connection conductive layers are formed of the material for the data line, wherein the first and second connection conductive layers are in contact with the gate and data pads. In this case, it is possible to improve the yield by simplifying the fabrication process with one diffraction exposure.

In case of the LCD device according to the second embodiment, the gate insulating layer is removed from the opening of the pixel region, so that it is possible to minimize the size of diffraction part in the diffraction mask. Also, the active layer is removed together when etching the gate insulating layer, so that it is possible to prevent bright spots from being generating. Also, the gate insulating layer and the insulating interlayer are removed from the opening of the pixel region, thereby improving the transmissivity in the LCD device according to the present invention.

In the LCD device according to the third embodiment, the diffraction part corresponds to the channel region, so that it is possible to decrease the size of the diffraction part in the diffraction mask. Also, it is possible to prevent the gate insulating layer from being damaged by wet etching since the size of removing the gate insulating layer is small.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

What is claimed is:

1. A method for fabricating a color-filter on transistor (COT) type liquid crystal display (LCD) device the method comprising:

forming a gate line, a gate electrode, a gate pad and a data pad on a substrate;

depositing a gate insulating layer and an active layer on a surface of the substrate;

patterning the active layer, and forming a contact hole to expose the gate pad and the data pad;

forming a data line intersecting the gate line to define a unit pixel region, source and drain electrode on the active layer, and first and second connection conductive layers being in contact with the gate pad and the data pad through the contact hole;

forming an insulating interlayer on the substrate exposing portions of the first and second connection conductive layers and portions of the drain electrode;

forming a color filter layer and a black matrix layer on the insulating interlayer;

forming an overcoat layer on portions of the color filter layer not including the first and second connection conductive layers and the drain electrode; and forming a pixel electrode on the overcoat layer contacted with the drain electrode and forming a first and a second transparent conductive layers covering the first and second connection conductive layers.

2. The method of claim 1, wherein the patterning the active layer and the forming a contact hole for exposing the gate pad and the data pad are performed simultaneously.

3. The method of claim 1, further comprising, forming a common line in parallel with the gate line, and a first common electrode protruding substantially perpendicular to the common line.

4. The method of claim 3, wherein the first common electrode is formed on both sides of the data line.

5. The method of claim 3, wherein a portion of the drain electrode overlapped with the common line forms a storage capacitor.

6. The method of claim 3, further comprising, forming a second common electrode between the pixel electrodes.

7. The method of claim 6, wherein the second common electrode is connected with the common line.

8. The method of claim 1, wherein the method of patterning the active layer and forming the contact hole includes:

coating a photoresist on the active layer;

diffractively exposing the photoresist;

patterning the photoresist by development;

forming the contact hole by removing the active layer and the gate insulating layer exposed by the patterned photoresist;

removing the active layer by ashing the photoresist until the gate insulating layer is exposed; and stripping the photoresist.

9. The method of claim 8, wherein the photoresist is patterned to have the different thicknesses such that the photoresist above the gate electrode is not removed, the photoresist corresponding to the contact hole is completely removed, and the remaining portions of the photoresist are formed thinner than the photoresist above the gate electrode.

10. The method of claim 1, wherein an opening is formed in the pixel region when patterning the active layer and forming the contact hole.

11. The method of claim 10, wherein the process of forming the opening in the pixel region with patterning the active layer and forming the contact hole includes:

coating a photoresist on the active layer;

diffractively exposing the photoresist;

patterning the photoresist by development;

forming the contact hole and the opening in the pixel region by removing the active layer and the gate insulating layer exposed by the patterned photoresist;

removing the active layer by ashing the photoresist until the gate insulating layer is exposed; and stripping the photoresist.

12. The method of claim 11, wherein the photoresist is patterned to have the different thicknesses such that the photoresist above the gate electrode is not removed, the photoresist corresponding to the contact hole is completely removed, and the remaining portions of the photoresist are thinner than the photoresist above the gate electrode.

13. The method of claim 10, wherein the insulating interlayer is removed from the opening of the pixel region when forming the insulating interlayer.

14. A method for fabricating a COT type LCD device comprising:

forming a gate line, a gate electrode, a gate pad and a data pad on a substrate;

depositing a gate insulating layer and an active layer on a surface of the substrate including the gate line;

forming a contact hole to expose the gate pad and the data pad by removing the gate insulating layer and the active layer;

forming a data line, source and drain electrodes and first and second connection conductive layers by depositing a metal layer on the surface of the substrate including the active layer and patterning the active layer and the metal layer;

forming an insulating interlayer on the substrate exposing portions of the first and second connection conductive layers and portions of the drain electrode;

forming a color filter layer and a black matrix layer on the insulating interlayer;

forming an overcoat layer on the remaining portions of the color filter layer not including the first and second connection conductive layers and the drain electrode; and forming a pixel electrode on the overcoat layer contacted with the drain electrode and forming a first and a second transparent conductive layers covering the first and second connection conductive layers.

15. The method of claim 14, further comprising, forming a common line in parallel with the gate line, and a first common electrode substantially perpendicular to the common line.

16. The method of claim 15, wherein the first common electrode is formed at both sides of the data line.

17. The method of claim 15, wherein a portion of the drain electrode overlapped with the common line forms a storage capacitor.

18. The method of claim 15, further comprising, forming a second common electrode between the pixel electrodes.

19. The method of claim 18, wherein the second common electrode is connected with the common line.

20. The method of claim 14, wherein the process of simultaneously patterning the active layer and the metal layer includes:

coating a photoresist on the metal layer;

diffractively exposing the photoresist;

patterning the photoresist by development;

removing the active layer and the metal layer exposed by the patterned photoresist;

removing the metal layer by ashing the photoresist until the metal layer above the gate electrode is exposed; and stripping the photoresist.

21. The method of claim 20, wherein the photoresist is patterned to have the different thicknesses such that the photoresist corresponding to the data line, the source and drain electrodes and the first and second connection conductive layers is not removed, the remaining portions of the photoresist are completely removed, and the photoresist corresponding to the gate electrode is formed is not removed and is formed a thickness less than that of the photoresist corresponding to the data line.

* * * * *